United States Patent
Baird

(10) Patent No.: US 8,198,566 B2
(45) Date of Patent: Jun. 12, 2012

(54) LASER PROCESSING OF WORKPIECES CONTAINING LOW-K DIELECTRIC MATERIAL

(75) Inventor: Brian W. Baird, Oregon City, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1345 days.

(21) Appl. No.: 11/440,711

(22) Filed: May 24, 2006

(65) Prior Publication Data

US 2007/0272555 A1 Nov. 29, 2007

(51) Int. Cl.
*B23K 26/00* (2006.01)
(52) U.S. Cl. .......... 219/121.69; 219/121.68; 219/121.67
(58) Field of Classification Search ............. 219/121.69, 219/121.68, 121.67; 438/460, 462, 463
See application file for complete search history.

(56) References Cited

U.S. PATENT DOCUMENTS

| | | | |
|---|---|---|---|
| 4,288,776 A | 9/1981 | Holmes | |
| 4,399,345 A | 8/1983 | Lapham et al. | |
| 4,598,039 A | 7/1986 | Fischer et al. | |
| 4,708,747 A | 11/1987 | O'Mara, Jr. | |
| 4,792,779 A | 12/1988 | Pond et al. | |
| 4,914,663 A | 4/1990 | Basu et al. | |
| 4,965,803 A | 10/1990 | Esterowitz et al. | |
| 5,068,867 A * | 11/1991 | Hasenberg et al. | 372/45.012 |
| 5,208,437 A | 5/1993 | Miyauchi et al. | |
| 5,265,114 A | 11/1993 | Sun et al. | 372/69 |
| 5,296,674 A | 3/1994 | Praschek et al. | |
| 5,473,624 A | 12/1995 | Sun et al. | 372/69 |
| 5,569,398 A | 10/1996 | Sun et al. | 219/121.68 |
| 5,593,606 A | 1/1997 | Owen et al. | 219/121.71 |
| 5,644,587 A * | 7/1997 | Kaneno et al. | 372/45.012 |
| 5,685,995 A | 11/1997 | Sun et al. | 219/121.6 |
| 5,725,914 A | 3/1998 | Opower | |
| 5,727,016 A * | 3/1998 | Paxton | 372/96 |
| 5,744,780 A | 4/1998 | Chang et al. | |
| 5,751,585 A | 5/1998 | Cutler et al. | 364/474.03 |
| 5,808,272 A | 9/1998 | Sun et al. | 219/121.68 |
| 5,832,018 A * | 11/1998 | Ohkubo | 372/45.011 |
| 5,841,099 A | 11/1998 | Owen et al. | 219/121.69 |
| 5,864,430 A | 1/1999 | Dickey et al. | 359/559 |
| 6,255,621 B1 | 7/2001 | Lundquist et al. | |
| 6,300,590 B1 | 10/2001 | Lauer et al. | |
| 6,621,040 B1 | 9/2003 | Perry et al. | |

(Continued)

FOREIGN PATENT DOCUMENTS

WO WO 03/002289 1/2003

OTHER PUBLICATIONS

Catchmark, Jeffrey M. et al., Direct Sub-100-nm Patterning of an Organic Low-k Dielectric for Electrical and Optical Interconnects, Journal of Electronic Materials, Mar. 2005, 7 pp.

(Continued)

*Primary Examiner* — M. Alexandra Elve
(74) *Attorney, Agent, or Firm* — Stoel Rives LLP

(57) ABSTRACT

Laser output including at least one laser pulse having a wavelength greater than 1.1 μm and shorter than 5 μm (preferably at about 1.1 μm) and having a pulsewidth shorter than 100 ps (preferably shorter than 10 ps) permits low-k dielectric material, such as SRO or SiCOH, to be removed without damaging the substrate. An oscillator module in cooperation with an amplification module are used to generate the laser output.

36 Claims, 6 Drawing Sheets

U.S. PATENT DOCUMENTS

| | | | |
|---|---|---|---|
| 6,703,582 B2 | 3/2004 | Smart et al. | |
| 6,734,387 B2 | 5/2004 | Kafka et al. | 219/121.68 |
| 7,057,133 B2 | 6/2006 | Lei et al. | |
| 7,088,756 B2 * | 8/2006 | Fermann et al. | 372/45.013 |
| 7,126,746 B2 * | 10/2006 | Sun et al. | 359/333 |
| 7,192,846 B2 | 3/2007 | Cordingley et al. | |
| 2002/0033558 A1 | 3/2002 | Fahey et al. | 264/400 |
| 2002/0149136 A1 | 10/2002 | Baird et al. | 264/400 |
| 2002/0167581 A1 | 11/2002 | Cordingley et al. | |
| 2003/0102291 A1 | 6/2003 | Liu et al. | |
| 2003/0156605 A1 * | 8/2003 | Richardson et al. | 372/25 |
| 2005/0041367 A1 | 2/2005 | Yoshii et al. | |
| 2005/0041976 A1 | 2/2005 | Sun et al. | |
| 2005/0045090 A1 * | 3/2005 | Ikegami et al. | 117/8 |
| 2005/0111500 A1 * | 5/2005 | Harter et al. | 372/25 |
| 2005/0190802 A1 * | 9/2005 | Richardson et al. | 372/25 |
| 2005/0265408 A1 | 12/2005 | Lei et al. | |
| 2005/0274702 A1 * | 12/2005 | Deshi | 219/121.72 |
| 2006/0000814 A1 * | 1/2006 | Gu et al. | 219/121.69 |
| 2006/0088984 A1 | 4/2006 | Li et al. | |
| 2006/0153254 A1 * | 7/2006 | Franjic et al. | 372/30 |
| 2006/0209908 A1 * | 9/2006 | Pedersen et al. | 372/6 |

OTHER PUBLICATIONS

Keller, Ursula, Recent Developments in Compact Ultrafast Lasers, Nature, vol. 424, Aug. 14, 2003, pp. 831-838.

Scherban, T. et al., Fracture of Low-k Dielectric Films and Interfaces, CP817, 8*th* International Workshop on Stress-Induced Phenomena in Metallization, 2006, pp. 83-91.

Zhao, Hanxie et al., Process Challenges in Low-k Wafer Dicing, 2003 IEEE/CPMT/SEMI Int'l Electronics Manufacturing Technology Symposium, 7 pp.

Jellison, Jr., G.E. et al., "Optical Properties of Heavily Doped Silicon between 1.5 and 4.1 eV", Physical Review Letters, vol. 46, No. 21., (May 1981), pub. by The American Physical Society, pp. 1414-1417.

Lapczyna, M., et al., Ultra High Repetition Rate (133 MHz) Laser Ablation of Aluminum with 1.2-ps. Pulses; Applied Physics A Materials Science & Processing, Springer-Verlag, 1999, pp. S883-S886.

Lei et al., U.S. Appl. No. 11/756,507, filed May 31, 2007.

International Search Report and Written Opinion concerning International Patent Application No. PCT/US2007/069483, which corresponds to the subject application.

Oct. 16, 2009 Office action concerning Chinese Application No. 2007800155335, which corresponds to the subject application.

May 11, 2011 Office action concerning Chinese Application No. 2007800155335, which corresponds to the subject application.

Sep. 16, 2011 Supplementary Search Report and Search Opinion concerning European Application No. 07797657.9, which corresponds to the subject application.

Chen, Y., et al., "Diode-Pumped Passively Q-Switched Nd:YAG Laser at 1123 nm;" *Applied Physics B* (Lasers and Optics), vol. 79, pp. 29-31. (Jul. 1, 2004).

Kleinbauer, J., et al., "A Powerful Diode-Pumped Laser Source for Micro-Machining with ps Pulses in the Infrared, the Visible and the Ultraviolet," *Applied Physics B* (Lasers and Optics), vol. 80, pp. 315-320. (Mar. 1, 2005).

Sulc, J., et al., "V:YAG Saturable Absorber for Flash Lamp and Diode Pumped Solid State Lasers;" (Solid State Lasers and Amplifiers), *Proceeding of SPIE*, vol. 5460, pp. 292-302. (Jan. 1, 2004).

Jan. 17, 2012 Office action concerning Korean Application No. 10-2008-7028301, which corresponds to the subject application.

* cited by examiner

| Wavelength (nm) | Optical Constants (n,k) | |
| --- | --- | --- |
| | SRO | SiCHO |
| 248 | 1.90, 0.312 | 1.48, 0.004 |
| 266 | 1.91, 0.244 | 1.48, 0.004 |
| 355 | 1.86, 0.088 | 1.44, 0.003 |
| 365 | 1.85, 0.079 | 1.44, 0.002 |
| 532 | 1.78, 0.016 | 1.42, 0 |
| 633 | 1.76, 0.008 | 1.42, 0 |
| 1047 | 1.72, 0 | 1.41, 0 |
| 1340 | 1.72, 0 | 1.41, 0 |

FIG. 3

LASER PROCESSING OF WORKPIECES CONTAINING LOW-K DIELECTRIC MATERIAL

RELATED APPLICATIONS

This application is a continuation of U.S. patent application No. 11/440,711.

TECHNICAL FIELD

The invention relates to laser machining and, in particular, to laser machining of workpieces containing a low-k dielectric material.

BACKGROUND OF THE INVENTION

Most semiconductor and related products, such as transistors, diodes, light-emitting diodes, microelectronic machine systems or micro-electro-mechanical systems (MEMS), planar waveguide structures, integrated circuits, and other microdevices, are manufactured contemporaneously in large batches on a large wafer. These wafers are typically composed of Si, GaAs, GaP, InP, Ge, silicon carbide, silicon nitride, sapphire, polymers, or other materials. The manufacture of these products or devices is most often performed using conventional fabrication techniques, such as, but not limited to, photolithography, oxidation, implantation, deposition, etching, epitaxial growth, and/or spin coating. Upon complete manufacture of these device-laden wafers, the individual devices must be separated or "singulated"—a process that is typically referred to as "dicing." In many singulation processes, the wafers are first separated into rows of components—a process typically referred to as "slicing"—but "slicing" and "dicing" may be used interchangeably. The individual devices are referred to as "die" or "dice." The areas on a wafer between active parts of adjacent dice are referred to as the "streets" or "dice lanes." The streets are limited to a minimum width because of the wafer material that is removed or destroyed during the dicing process. The wafer area that is completely removed by the dicing process is called a "kerf," and the rest of the street must accommodate any damage zone around the kerf and any manufacturing misalignment or dicing deviation from the straightness of the kerf.

Conventionally, dicing is performed using a wafer saw or by a technique called "scribe and break," in which a wafer is notched with a scribe line, often by a diamond point, and is then cleaved along the scribe line. Due to low-yield issues, such as unpredictable propagation of microcracks as well as observable damage to devices, associated with scribe-and-break techniques, mechanical dicing saws have become the predominant tool for dicing wafers. Conventional slicing blades typically have a dimension of about 50 to 200 microns (μm) along the cutting axis and produce cuts that are wider than the blades. The blades are that wide in order to withstand the stresses of repeatedly making straight cuts through the hard, thick materials of conventional wafers. The wide cuts made by the mechanical cutting blades often significantly reduce the number of rows and columns of die that can be fit onto each wafer. Dicing blades also tend to wear relatively quickly, such that the width of their cuts may vary over time. In some cases, the blades can be inadvertently bent, and then they produce curved or slanted cuts or increased chipping.

In addition, the dicing process creates small chips as it creates sharp edges and sharp corners along singulation paths and thereby makes the devices more susceptible to damage, particularly from external bumps. Dicing saws also tend to create microcracks that extend into the layers of devices from the kerf, reducing yields. In addition, microcracking may not be evident when the devices are tested, but may later propagate into the layers to later cause device failure, which reduces the reliability of the devices and the equipment based on them. Although some microcracking may be avoided by slowing the mechanical sawing speed, microcracking is very difficult, if not impossible, to avoid in some materials. Dicing saws also typically require the use of water as a lubricant and/or coolant, and the water can create problems or lower yields for certain types of materials or devices, such as MEMS.

Laser cutting is becoming an attractive alternative to the conventional mechanical cutting techniques. One reason for using laser dicing is that lasers can cut curved die such as arrayed waveguide gratings from a wafer, unlike either of the two conventional techniques. In addition, lasers can often cut without the use of water, which is of great importance for the manufacture of devices that are water-sensitive, such as MEMS. Lasers also offer the potential of the smallest street width available, due to a potentially very small kerf width and the possibility of very accurate alignment of the laser in relation to the workpiece (wafer).

Lasers also offer the ability to form patterns on wafers, creating features such as trenches or notches that can be made by scanning the laser across the surface and cutting only the film or cutting partly through the wafer, as opposed to mechanical-saw dicing techniques that permit only through-cuts. The partial cutting techniques can be used to make features on die or to perform laser scribing for a scribe-and-break process, for example.

Lasers also offer great potential for the drilling of vias through or into the film or substrate material. Such via drilling is of interest for reasons that may include, but are not limited to, allowing a ground to be contacted through the backside of a die, allowing die to be stacked on top of each other inside one package ("three-dimensional packaging"), or allowing devices to be mounted in a "flip-chip" BGA fashion such that the active devices would be facing up (with implications for MEMS or front-side cooling of integrated circuits or laser diodes). The diameter of these vias can range from several microns up to several hundred microns, and the die thicknesses of interest vary from tens of microns to almost 1,000 μm. Few production-worthy solutions currently exist for the drilling of such high-aspect-ratio vias, and those such as plasma etching tend to be cumbersome and expensive for equipment and maintenance.

Better methods for processing wafers and the materials they support are, therefore, desirable.

SUMMARY

In some embodiments, a low-k dielectric is processed with laser output having parameters including a wavelength and/or a pulsewidth that process the low-k dielectric material without operationally damaging the substrate. In some embodiments, laser output having a wavelength greater than about 1.1 μm is employed to process target portions of a low-k dielectric film supported by a wafer substrate. In some embodiments, the wavelength is about 1.3 μm.

In some embodiments, laser output including at least one laser pulse having a pulsewidth shorter than about 100 picoseconds is employed to process target portions of a low-k dielectric film supported by a wafer substrate. In some embodiments, the pulsewidth is shorter than 10 picoseconds. In some embodiments, the pulsewidth is longer than 1 femtosecond.

In some embodiments, the low-k dielectric material comprises SiOF, SIOB, SRO, SiCOH, BCB, or an organic material such as a polyimide-based or parylene-based polymer having a k value of less than 3. The low-k dielectric material may specifically comprise BlackDiamond®, which is a trademarked low-k dielectric sold by Applied Materials, or SiLK®, which is a trademarked low-k dielectric sold by Dow. In some embodiments, the substrate comprises single-crystal or polycrystalline or amorphous Si, GaAs, GaP, InP, Ge, silicon carbide, silicon nitride, sapphire, fused silica, glass, or polymers.

In some embodiments, the laser output is generated by an oscillator module in cooperation with an amplification module. In some embodiments, the oscillator module comprises a diode-pumped, solid-state (DPSS) master oscillator. In some embodiments, the oscillator module comprises a pulsed semiconductor laser emitting picosecond pulses. In some embodiments, the pulsed semiconductor laser employs an InGaAs/AlGaAs or InGaAsP/InP strained quantum well structure. In some embodiments, the oscillator module comprises a pulsed fiber master oscillator. In some embodiments, the pulsed fiber master oscillator comprises a diode-pumped, rare-earth-doped glass fiber master oscillator employing a semiconductor saturable-absorbing mirror. In some embodiments, the glass fiber master oscillator comprises a rare-earth-doped, fused silica fiber. The rare-earth dopants preferably comprise Nd, Yb, Ho, Er, Dy, Pr, Tm, or Cr.

In some embodiments, the amplification module comprises a single-pass, multipass, or regenerative DPSS amplifier. In some embodiments, the amplification module comprises a $Nd:GdVO_4$, $Nd:YVO_4$, Nd:YLF, Nd:glass, or Nd:YAG gain medium. In some embodiments, the amplification module comprises a diode-pumped, rare-earth-doped glass fiber power amplifier. In some embodiments, the glass fiber power amplifier comprises a rare-earth-doped, fused silica fiber. The rare-earth dopants preferably comprise Nd, Yb, Ho, Er, Dy, Pr, Tm, or Cr.

In some embodiments, the laser output comprises multiple independently triggered pulses or bursts of pulses selected from a pulse train emitted from the amplification module. In some embodiments, the laser pulse has an energy per pulse that is less than 75 microjoules ($\mu$J). In other embodiments, the laser pulse has an energy per pulse that is greater than 75 $\mu$J.

In some embodiments, a mechanical saw is employed to dice the substrate after the target portion of the low-k dielectric material is removed. In some embodiments, laser output having different parameters than those used for processing the low-k dielectric material is employed to process the wafer substrate. In some embodiments, a mechanical saw is employed to process the wafer substrate.

Additional aspects and advantages of the present invention will be apparent from the following detailed description of preferred embodiments, which proceeds with reference to the accompanying drawings.

BRIEF DESCRIPTION OF THE DRAWINGS

FIG. 3 is a table of optical constants of the low-k dielectric materials SRO and SiCOH at various wavelengths.

DETAILED DESCRIPTION OF PREFERRED EMBODIMENTS

Figure 1:
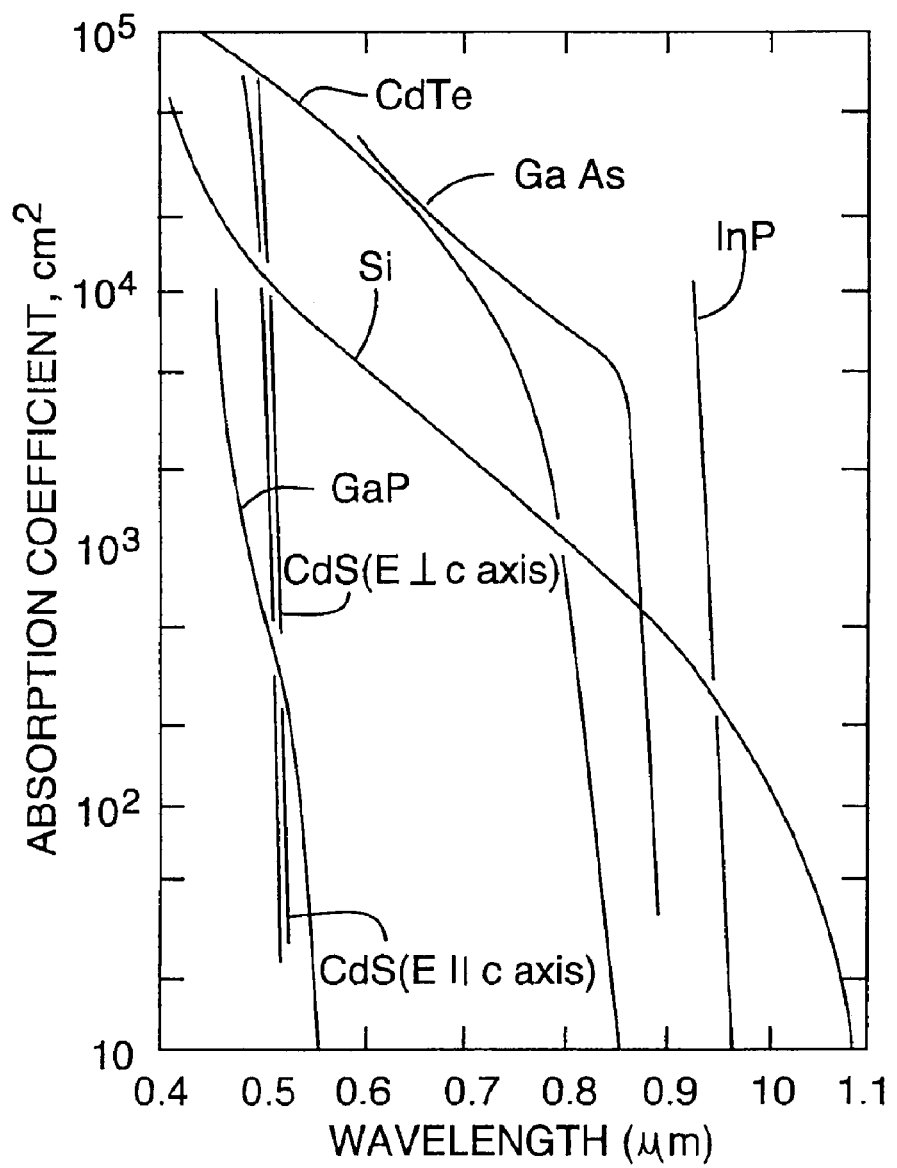
FIG. 1 shows graphical representations of the optical absorption properties versus wavelength for various semiconductor materials, including silicon, at room temperature.

Although laser processing capability has advanced greatly in the last few years due to advances both in available lasers and in process understanding, there are still some significant issues with the use of lasers for dicing, drilling, or patterning processes. Attempts may have been made to use infrared (IR) lasers to machine silicon or silicon oxides. Some traditional IR wavelengths have, to a limited extent, been shown to machine these materials and have been used successfully as laser scribing tools for marking die or for limited scribe-and-break applications. These lasers, however, tend to damage silicon by, for example, unpredictably cracking the silicon or oxide layers; throwing permanent redeposited material, such as melted slag, onto the top surface of the wafer; and creating a "melt lip" where the edge of the kerf pulls backward and up.

U.S. Pat. Nos. 5,593,606 and 5,841,099 ('099 patent) of Owen et al. describe techniques and advantages for employing ultraviolet (UV) laser systems to generate laser output pulses within advantageous parameters to form through-hole or blind vias through at least two different types of layers in multilayer devices. These parameters generally include non-excimer output pulses having temporal pulse widths of shorter than 100 nanoseconds (ns), spot areas with spot diameters of less than 100 $\mu$m, and average intensities or irradiances of greater than 100 milliwatts (mW) over the spot areas at repetition rates greater than 200 hertz (Hz). The '099 patent describes techniques that, after first processing a top metal layer, facilitate changing parameters, such as the power density, of the laser system output to process nonmetallic interlayers, including dielectric or reinforcement materials, in a manner that protects a bottom metal layer from damage.

Despite the foregoing, lasers have not until recently been employed successfully to dice or pattern silicon or other types of semiconductor wafers or to dice or pattern sapphire or other insulator wafers. U.S. Pat. Pub. No. US-2002-0033558 (U.S. patent application Ser. No. 09/803,382 ('382 application)) of Fahey et al. describes a UV laser system and a method for separating rows or singulating sliders or other components. These methods include various combinations of laser and saw cutting directed at one or both sides of a wafer and various techniques for edge modification.

U.S. Pat. Pub. No. US-2002-0149136 (U.S. patent application Ser. No. 10/017,497 ('497 application)) of Baird et al. further describes using UV laser ablation to directly and rapidly form patterns with feature sizes of less than 50 $\mu$m in hard-to-cut materials, such as silicon. These patterns include formation of very high-aspect-ratio cylindrical openings or blind vias for integrated circuit connections, singulation of processed dies contained on silicon wafers, and microtab cutting to separate microcircuits formed in silicon from a parent wafer.

As discussed in detail in the '382 and '497 applications, it is possible to determine many of several laser and optical processing parameters that can be optimized to cleanly cut a given material using a laser. These parameters may include, but are not limited to, wavelength, repetition rate, distance of new target material impinged by each sequential laser pulse (bite size), energy of each laser pulse, temporal pulse width, size of spot of laser system output, and spatial energy distribution within the laser spot. The parameters of choice for cutting a particular material can vary considerably, and the "process window"—the area of parameter space in which a given material can be cleanly ablated—differs for different materials. Even materials that appear to be the same (such as various types of $SiO_2$, SiON, or $Si_3N_4$) can have very different optical, mechanical, and thermal/ablative properties due to factors that may include, but are not limited to, different dopant, different stoichiometry, different deposition technique, different microstructure (due to the above or due to different underlayer, processing temperature profile, etc.), or different macrostructure (porosity, geometry, or thickness). Thus, closely related materials may still have nonmatching process parameters and process windows.

In many circumstances, the streets between the die on the wafers are covered with some or all of the overlying device layers, or the devices themselves are formed across the dice lanes. So, although the majority of the wafer thickness is usually taken up by the substrate material, it is desirable to first cut through the overlying device layers before cutting the substrate material and/or to pattern oxide or other device layers supported on a wafer before patterning or cutting the substrate material. Most devices are, however, made of several different materials, usually deposited or grown on top of the wafer in a buildup process. These materials may include, but are not limited to, metals, oxide dielectrics, nitrides, silicides, polymer dielectrics, and other semiconductor layers. In general, two or more different materials do not respond in the same fashion to a particular set of laser parameters, so the layers supported by a wafer substrate are either relatively poorly processed at the substrate-cutting parameters or are severely compromised during the laser cutting of the wafer. The resulting problems range from decreased cutting rate (if the laser is not efficient in cutting the overlayers) to the creation of a large damage region in the device layers in proximity to the laser processing area. For example, although IR lasers have had limited success in dicing or scribing silicon, these lasers have been unable to cut through $SiO_2$ or other oxide layers on top of a silicon wafer.

Similarly, mechanical dicing techniques are well known to cause cracking, chipping, and/or delamination in layers, especially layers that are brittle and/or have low adhesion. As layer stacks get more complicated, and with the introduction of more-fragile materials such as oxide-based or other low-k dielectrics, this problem is expected to become worse, and certainly not less of an issue.

In International Pub. No. WO 03/002289 (U.S. patent application Ser. No. 10/187,400), Fahey et al. provide methods to dice, pattern, or drill wafer-supporting device layers by employing two or more different techniques or parameters to address different properties of the device layers and the wafer substrate material.

This multistep process involves optimization of processes for at least two layers, and preferably such that the processing of any layer, including the substrate material layer, does not negatively affect the other layers. An exemplary embodiment employs one laser used at different sets of parameters, such as different wavelengths or irradiances, to process the different layer or substrate materials. Another embodiment employs different lasers having different sets of parameters for processing the different layer or substrate materials, such as the use of a UV laser (e.g., at 266 nanometers (nm)) or an ultrafast laser for cutting device layers that are transparent in the IR or visible range and the use of an IR, visible, or UV laser (e.g., at 355 nm) to process the wafer material. A further embodiment employs one or more lasers to process the device layers and then employs a nonlaser technique, such as a mechanical saw blade, to process most or all of the thickness of the wafer substrate material.

Still other embodiments entail covering the surface device layers of the wafer with a sacrificial layer such as photoresist or PVA; optionally removing a portion of the sacrificial layer to create uncovered zones over intended cutting areas; laser cutting the layers atop the wafer substrate to a width equal to or slightly greater than that which will occur in the subsequent substrate-cutting step; and then cutting the wafer with a separate processing step or steps using different wavelength, pulse width, fluence, bite size, and/or other laser processing parameters.

Despite the aforementioned advances, laser processing low-k dielectric films on wafers has not met with great success. Ellipsometer measurements, listed in the table of FIG. 3, of the low-k dielectric materials SRO and SiCOH at various wavelengths, suggest that these materials would offer little probability of employing an efficient laser process at wavelengths longer than about 532 nm. Moreover, the zero value of these low-k dielectric films measured at wavelengths longer than about 532 nm suggests little probability of an efficient laser process to remove these films at conventional solid-state IR laser wavelengths.

Applicant has, however, discovered that low-k dielectric materials can be processed at conventional IR wavelengths when the laser pulses are delivered at short pulsewidths such as shorter than 100 picoseconds. Preferred embodiments include pulsewidths shorter than or equal to about 10 picoseconds.

In U.S. Pat. No. 5,265,114 and U.S. Pat. No. 5,473,624, Sun et al. disclose using laser output at a wavelength, such as 1.3 μm, having a laser energy absorption contrast between the memory link material and silicon substrate that is much larger than that at the traditional 1 μm laser wavelength, so potential damage to the silicon substrate is reduced. The much wider laser processing window and better processing quality afforded by this technique have been used in link-blowing processes with great success.

Figure 2:
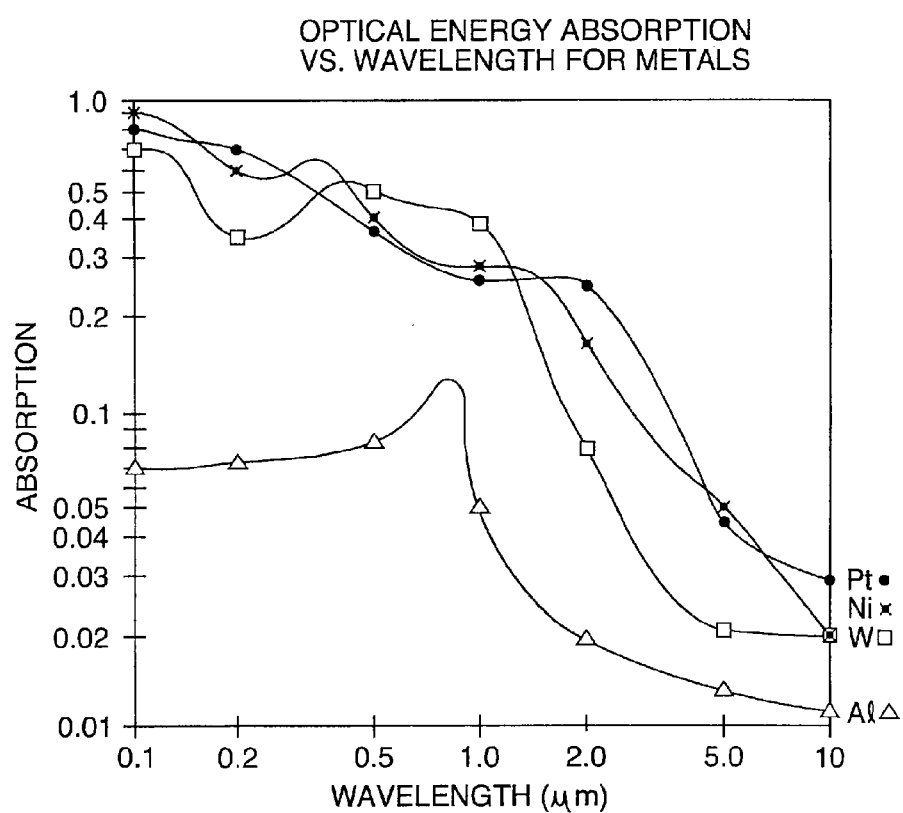
FIG. 2 shows graphical representations of the optical absorption properties versus wavelength for various metals.

In U.S. Pat. No. 5,569,398, U.S. Pat. No. 5,685,995, and U.S. Pat. No. 5,808,272, Sun et al. disclose using laser output at a wavelength, such as 1.3 μm, for various trimming operations to improve processing, measurement, and throughput of passive, active, or opto-electric devices that may or may not be powered up during processing. FIGS. 1 and 2, taken from these Sun et al. patents, demonstrate the significant change in absorption contrast between various metals used for semiconductor links and silicon used for wafer substrates.

FIG. 3 is a table of optical constants of the low-k dielectric materials SRO and SiCOH at various wavelengths. The optical constants were obtained through ellipsometric measurements. As those skilled in the art will recognize, ellipsometers measure the change in polarization state of light reflected from a sample surface and determine the parameters Δ and ψ, which are related to the ratio of the Fresnel reflection coefficients for p- and s-polarized light.

As is well known to those skilled in the art, values of the optical constants n and k can then be directly computed from the ellipsometer measurements of the parameters Δ and ψ.

As those skilled in the art will recognize, once the optical constants have been obtained, the absorption coefficient can be computed using the equation:

$$\alpha = \frac{4\pi k}{\lambda}, \quad (1)$$

where $\alpha$ is the absorption coefficient, $\lambda$ is the wavelength, and $k$ is the extinction coefficient.

In contradistinction with the patents of Sun et al., in which the absorption contrast between a conductive link and underlying silicon substrate is exploited, ellipsometer-derived measurements of the extinction coefficient k suggest that there is little absorption contrast between the low-k dielectric materials and a silicon substrate, for example. Nevertheless, applicant has determined that, at wavelengths longer than or equal to about 1.1 µm (and preferably at about 1.3 µm), low-k dielectric materials can be processed at short pulsewidths and the silicon substrate maintains its relatively low absorption of any residual laser output having these wavelength and pulsewidth parameters. Applicant postulates that the high peak power of the ultrafast pulses incident upon the low-k dielectric layer modifies the optical constants of the low-k dielectric material to allow efficient processing, while the optical constants of the silicon substrate are not significantly changed.

Representative low-k dielectric materials generally have a k value less than 3 and may include, but are not limited to, fluorinated silicate glasses (such as FSG or SiOF), fluorinated amorphous carbon (a-CF), SiOB, SRO, SiCOH, benzocyclobutene (BCB), methyl silsesquioxane (MSQ), hydrogen silsesquioxane (HSQ), a methylated silica from tetramethyl silane, teflon (PTFE), a pourous material (a xerogel or a polymer nanfoams), and an organic material such as a polyimide, fluorinated polyimide, polyimide-based polymer, a parylene-based polymer, or a polyarylether. The low-k dielectric material may specifically comprise BlackDiamond®, which is a trademarked low-k dielectric sold by Applied Materials, or SiLK®, which is a trademarked low-k dielectric sold by Dow.

Figure 4:
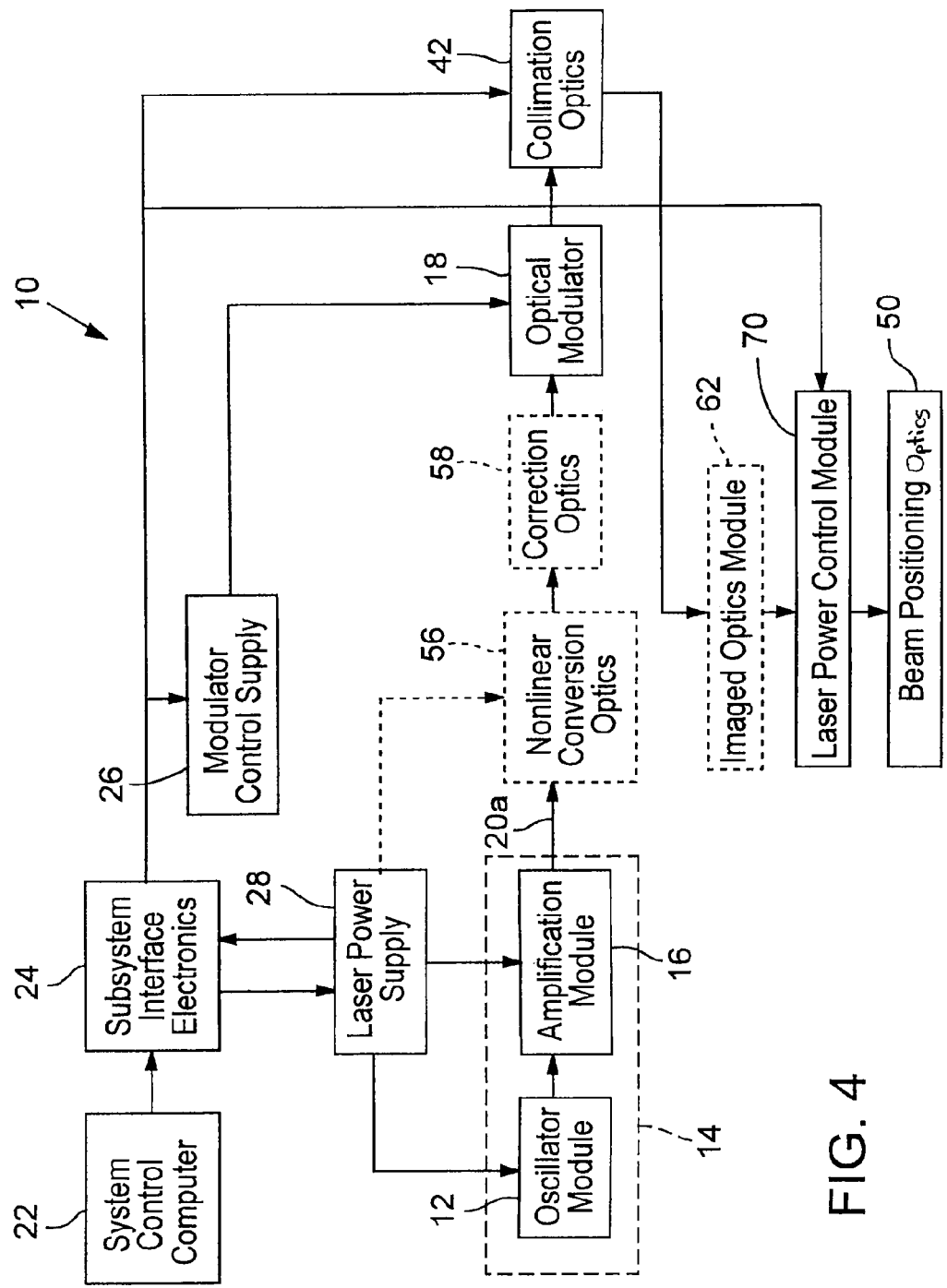
FIG. 4 is a simplified schematic diagram of an exemplary laser system for processing low-k dielectric material supported on a substrate.

FIG. 4 is a simplified schematic diagram of an exemplary laser system 10 for processing low-k dielectric material supported on a substrate. With reference to FIG. 4, the laser system 10 preferably employs a high average power pulsed picosecond laser subsystem 14 that includes a dynamic laser pulse generator or oscillator module 12 and an amplification module 16, such as a DPSS power amplifier.

The dynamic laser pulse generator or oscillator module 12 preferably employs a diode-pumped master oscillator to emit oscillator output pulses having a pulsewidth that is shorter than about 500 picoseconds, preferably shorter than about 100 picoseconds, and more preferably shorter than 10 picoseconds, at a wavelength greater than about 1.1 µm, preferably less than 5 µm, and more preferably near about 1.3 µm. The oscillator output pulses are directed into the amplification module 16. The amplification module 16 may be a single-pass, multipass, or regenerative DPSS amplifier. Alternatively, the amplification module 16 may be a diode-pumped, rare-earth-doped glass gain fiber power amplifier. In some embodiments, the glass fiber power amplifier comprises a rare-earth-doped, fused silica fiber. In yet another embodiment, the amplification module 16 may be a diode-pumped, rare-earth-doped glass photonic crystal fiber power amplifier. In some embodiments, the rare-earth-doped glass photonic crystal fiber power amplifier comprises a rare-earth-doped, fused silica photonic crystal fiber power amplifier. The rare-earth dopants preferably comprise Nd, Yb, Ho, Er, Dy, Pr, Tm, or Cr.

The oscillator module 12 and the amplification module 16 preferably employ Nd-doped lasants as gain materials. A preferred Nd-doped lasant is Nd:GdVO$_4$, but alternative Nd-doped lasants include, but are not limited to, Nd:YVO$_4$, Nd:YLF, Nd:glass, and Nd:YAG. The oscillator module 12 and the amplification module 16 may comprise the same or different lasants with the same or different doping concentrations. The oscillator module 12 and the amplification module 16 also preferably employ frequency-selecting elements, prisms, filters, etalons, and/or other elements well known to skilled practitioners in order to preferentially produce gain at the desired wavelength, such as at about 1.3 µm, and introduce losses at higher gain transitions, such as at 1.06 µm, as in the case of a Nd:GdVO$_4$ lasant.

In an exemplary embodiment, an external optical modulator 18, such as an acousto-optic modulator (AOM) or an electro-optic modulator (EOM), can be triggered to provide laser output 20a that may contain a single pulse, multiple independently triggered pulses, or bursts of pulses selected from a pulse train emitted from the amplification module 16 of the picosecond laser subsystem 14. The laser pulses of the laser output 20a have high average power. The optical modulator 18 may be triggered directly or indirectly by a system control computer 22, subsystem interface electronics 24, and/or a modulator control supply 26, as known to skilled practitioners. The trigger timing may be coordinated, if desirable, with the control of the laser power supply 28 directly or indirectly by the system control computer 22 and/or the subsystem interface electronics 24. Skilled persons will appreciate that useful AOM modulation techniques are disclosed in U.S. Pat. No. 7,019,891 and can be employed in many embodiments. U.S. Pat. No. 7,019,891 is herein incorporated by reference.

In another exemplary embodiment, the oscillator module 12 may comprise a pulsed semiconductor laser emitting picosecond pulses. Exemplary pulsed lasers may be fabricated by known techniques using an InGaAs/AlGaAs or InGaAsP/InP strained quantum well structure emitting at a wavelength greater than 1.1 µm. Skilled persons will appreciate that other semiconductor laser material systems may alternatively be employed.

In another exemplary embodiment, the oscillator module 12 may comprise a pulsed fiber master oscillator. An exemplary pulsed fiber master oscillator may be a diode-pumped, Nd-doped or Yb-doped silica fiber master oscillator employing a semiconductor saturable absorbing mirror (SESAM). Skilled persons will appreciate that other rare-earth-doped fibers may alternatively be employed and that other mode-locking elements may alternatively be employed.

In another exemplary embodiment, the amplification module 16 may be a diode-pumped, Yb-doped silica fiber power amplifier. In yet another exemplary embodiment, the amplification module 16 may be a diode-pumped, Nd-doped silica fiber power amplifier. Skilled persons will appreciate that other rare-earth-doped fibers may alternatively be employed for amplification module 16. Skilled persons will appreciate that fibers employing step index profiles, step index profiles incorporating polarization maintaining elements, or air gap profiles may be employed.

Figures 5, 6:
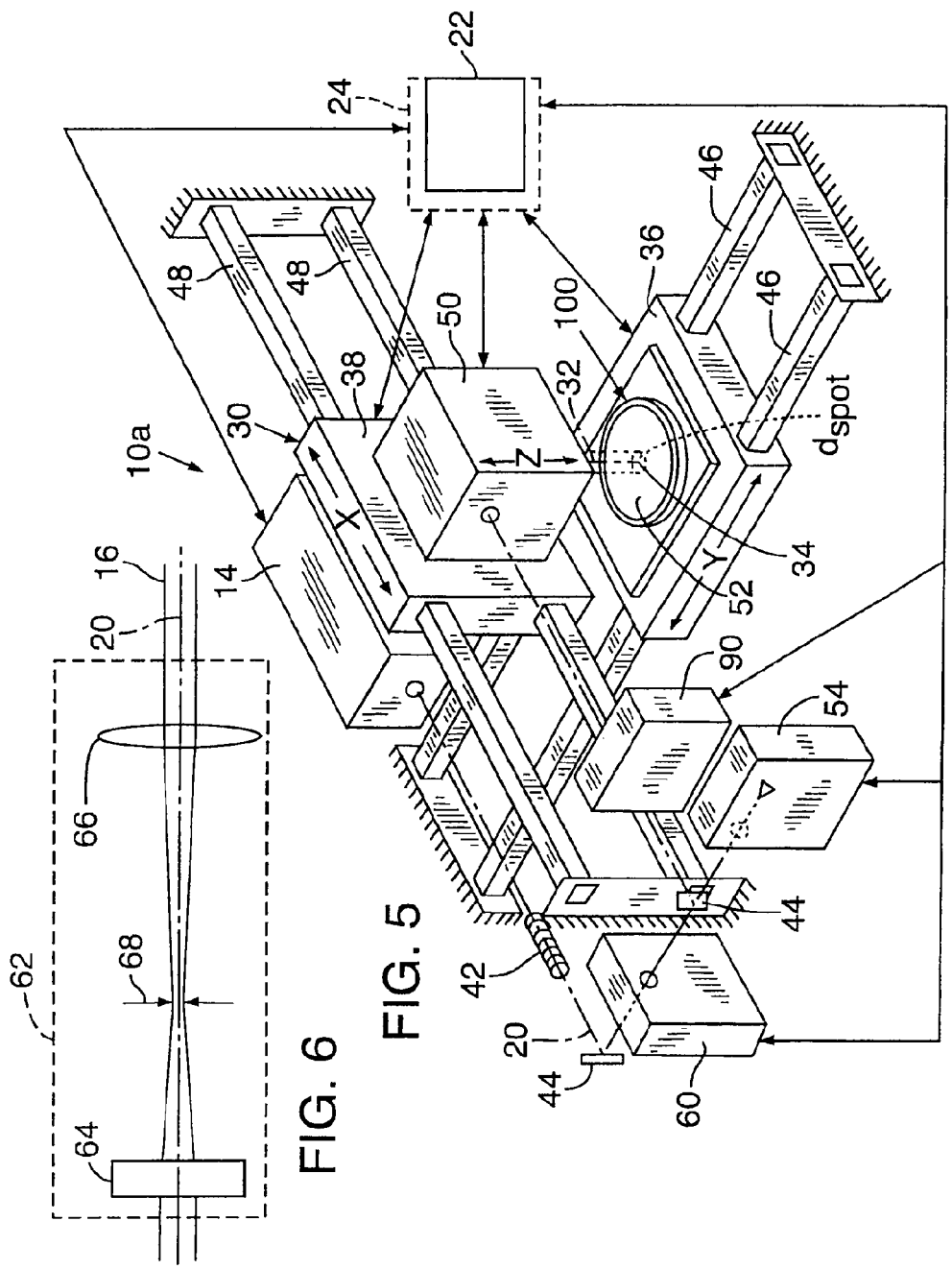
FIG. 5 is a simplified partly pictorial and partly schematic diagram of the laser system of FIG. 4, showing some components of an exemplary beam-positioning system.
FIG. 6 is a simplified pictorial diagram of an optional imaged optics module that may be used in an exemplary laser system.

With reference to FIG. 5, the laser output 20a is optionally passed through a variety of well-known expansion and/or collimation optics 42, propagated along an optical path 20, and directed by a beam-positioning system 30 to impinge laser system output pulse(s) 32 on a desired laser target position 34 on a workpiece 52 such as a silicon wafer. An exemplary beam-positioning system 30 may include a translation stage positioner that may employ at least two transverse stages 36 and 38 that support, for example, X, Y, and/or Z positioning mirrors 44 and permit quick movement between the target positions 34 on the same or different workpieces 52.

In an exemplary embodiment, the translation stage positioner is a split-axis system in which a Y stage 36, typically moved by linear motors along rails 46, supports and moves the workpiece 52, and an X stage 38, typically moved by linear motors along the rails 48, supports and moves beam-positioning optics such as a fast positioner 50 and associated focusing lens(es) and/or other optics. The Z dimension between the X stage 38 and the Y stage 36 may also be adjustable. The positioning mirrors 44 align the optical path 20 through any turns between the laser subsystem 14 and the fast positioner 50, which is positioned along the optical path 20. The fast positioner 50 may, for example, employ high-resolution linear motors, one or more galvanometer mirrors, fast steering mirrors, and/or acousto-optic steering techniques that can effect unique or repetitive processing operations based on provided test or design data. The stages 36 and 38 and the positioner 50 can be controlled and moved independently or coordinated to move together in response to panelized or unpanelized data. A split-axis beam-positioning system 30 is preferred for use in large-area-of-travel applications, such as cutting 203 mm (8") and especially 305 mm (12") or larger wafers.

The fast positioner 50 may also include or be associated with a vision system that can be aligned to one or more fiducials on the surface of the workpiece 52. The beam-positioning system 30 can employ conventional vision or beam-to-work alignment systems that work through a shared objective lens, or off-axis, with a separate camera and that are well known to skilled practitioners. In one embodiment, an HRVX vision box employing Freedom Library software in a positioning system 30 sold by Electro Scientific Industries, Inc. is employed to perform alignment between the laser subsystem 14 and the target positions 34 on the workpiece 52. Other suitable alignment systems are commercially available. An exemplary alignment system may employ bright-field, on-axis illumination, particularly for specularly reflecting workpieces such as lapped or polished wafers, but dark-field illumination or a combination of dark-field illumination and bright-field illumination may be employed.

For laser cutting operations as later described, the beam-positioning system 30 is preferably aligned to conventional typical saw cutting or other fiducials or a pattern on the wafer surface. Once the low-k dielectric material has been removed, alignment to the kerf edges may be preferred. The beam-positioning system 30 preferably has alignment accuracy of better than about 3-5 µm, such that the center of the laser spot is within about 3-5 µm of a preferred cutting path, particularly for laser beam spot sizes such as 10-15 µm. For smaller spot sizes, the alignment accuracy may preferably be even better. For larger spot sizes, the accuracy can be less precise. In addition, the beam-positioning system 30 may also employ an Abbe errors correction system such as that described in detail in U.S. Pat. No. 6,430,465, the relevant portions of which are herein incorporated by reference.

Many variations of the beam-positioning system 30 are well known to skilled practitioners, and some embodiments of the beam-positioning system 30 are described in detail in U.S. Pat. No. 5,751,585 of Cutler et al. The ESI Model 2700 or 5320 micromachining systems available from Electro Scientific Industries, Inc. of Portland, Oreg. are exemplary implementations of the beam-positioning system 30. Other exemplary beam-positioning systems such as model series numbers 27xx, 43xx, 44xx, or 53xx, manufactured by Electro Scientific Industries, Inc. in Portland, Oreg., can also be employed. Some of these systems that use an X-Y linear motor for moving the workpiece 52 and an X-Y stage for moving the scan lens are cost-effective positioning systems for making long, straight cuts. Skilled persons will also appreciate that a system with a single X-Y stage for workpiece positioning with a fixed beam position and/or stationary galvanometer for beam positioning may alternatively be employed. Those skilled in the art will recognize that such a system can be programmed to utilize toolpath files that will dynamically position at high speeds the laser system output pulses 32 to produce a wide variety of useful patterns, which may be either periodic or nonperiodic. Skilled persons will also appreciate that AOM beam-steering techniques disclosed in U.S. Pat. No. 7,019,891 can be used in combination with or substituted for the fast positioner 50 and/or the beam-positioning system 30.

The laser output 20a may also be directed through additional conventional system optical elements that may include, but are not limited to, optional nonlinear conversion optics 56, optional correction optics 58, and/or optional imaged optics module 62, which may be employed to control the output power and shape the beam profile of the laser pulses received at the target or workpiece surface.

With reference to FIG. 6, the optional imaged optics module 62 may include an optical element 64, a lens 66, and an aperture mask 68 placed at or near the beam waist created by the optical element 64 to block any undesirable side lobes and peripheral portions of the beam so that a precisely shaped spot profile is subsequently imaged onto the work surface. In an exemplary embodiment, the optical element 64 is a diffractive device or lens, and the lens 66 is a collimating lens to add flexibility to the configuration of the laser system 10.

Varying the size of the aperture to match the properties of the optical element 64 can control the edge sharpness of the spot profile to produce a size-specified, sharper-edged intensity profile that should enhance the alignment accuracy. In addition, with this arrangement, the shape of the aperture can be precisely circular or can be changed to rectangular, elliptical, or other noncircular shapes that can be aligned parallel or perpendicular to a cutting direction. The aperture mask 68 may optionally be flared outwardly at its light-exiting side. For UV laser applications, the aperture mask 68 in the imaged optics module 62 preferably comprises sapphire. Skilled persons will appreciate that the aperture mask 68 can be used without the optical element 64 and the lens 66.

In an alternative embodiment, optical element 64 includes one or more beam-shaping components that convert laser pulses having a raw Gaussian irradiance profile into shaped (and focused) pulses that have a near-uniform "top hat" profile, or particularly a super-Gaussian irradiance profile, in proximity to an aperture mask 68 downstream of the optical element 64. Such beam-shaping components may include aspheric optics or diffractive optics. In one embodiment, the lens 66 comprises imaging optics useful for controlling beam size and divergence. Skilled persons will appreciate that a single imaging lens component or multiple lens components could be employed. Skilled persons will also appreciate, and it is currently preferred, that shaped laser output can be employed without using an aperture mask 68.

In one embodiment, the beam-shaping components include a diffractive optic element (DOE) that can perform complex beam shaping with high efficiency and accuracy. The beam-shaping components not only transform the Gaussian irradiance profile to a near-uniform irradiance profile, but they also focus the shaped output to a determinable or specified spot size. Although a single-element DOE is preferred, skilled persons will appreciate that the DOE may include multiple separate elements such as the phase plate and transform elements disclosed in U.S. Pat. No. 5,864,430 of Dickey et al., which also discloses techniques for designing DOEs for the purpose of beam shaping. The shaping and imaging techniques discussed above are described in detail in U.S. Pat. No. 6,433,301, the relevant portions of which are herein incorporated by reference.

A laser power control module 70 may be employed to achieve laser pulse power control by using modulation methods including, but not limited to, diode pump modulation or external modulation (such as with an external power controller 60, including but not limited to, AOMs or EOMs, or motorized polarization rotation optics positioned along the optical path 20) or a combination thereof. In addition, one or more beam-detection devices 54, such as photodiodes, may be downstream of the laser power controller 60, such as aligned with a positioning mirror 44 that is adapted to be partly transmissive to the wavelength of the laser output 20a. The beam-detection optics and electronics may be associated directly or indirectly with the laser power control module 70, and/or may be directly or indirectly in communication with the system control computer 22 and/or the subsystem interface electronics 24, and/or may be used to sample modulated laser output 20a and generate correction signals to the modulators and/or other system optical elements to produce stable modulated output having parameters desirable for processing the workpiece 52. Conventional power-control techniques are known to skilled practitioners. Some exemplary AOM power-control techniques are disclosed in U.S. Pat. No. 7,019,891.

Typical pulse repetition frequencies employed range from 100 KHz to 10 MHz. Certain applications may employ pulse repetition frequencies in the range from 10 MHz to 100 MHz. Typical focused spot sizes employed range from 10 µm to 100 µm. Certain applications may employ spot sizes in the range from 1.5 µm to 10 µm. Typical bite sizes employed range from 1 nm to 10 µm. Typical velocities employed range from 10 mm/s to 1,000 mm/s.

Figure 7:
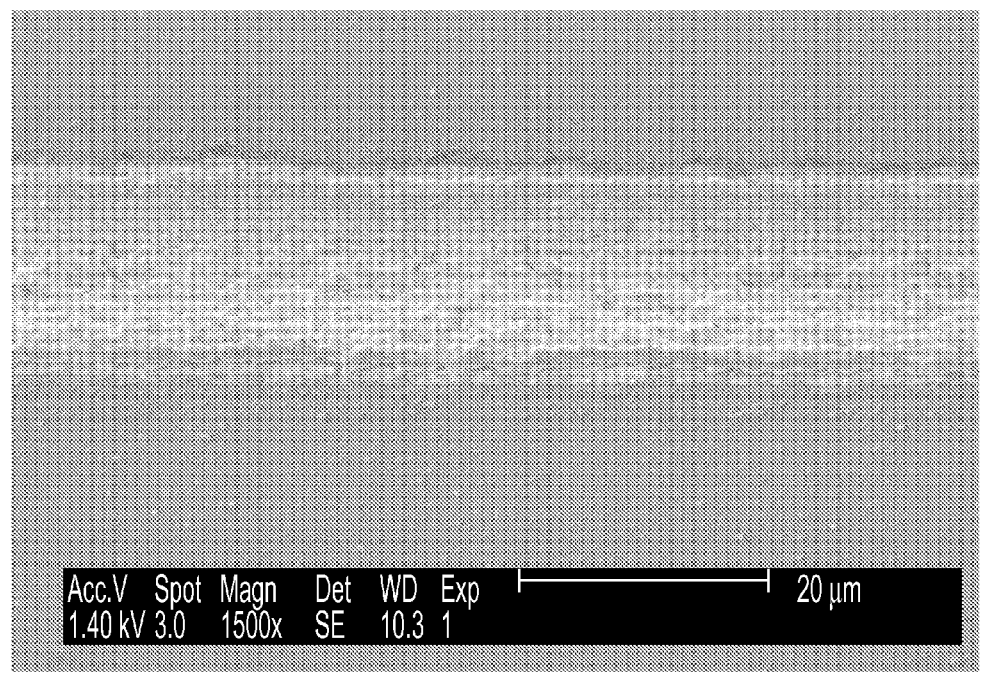
FIG. 7 is an electron micrograph image of a cut made through a layer of a low-k dielectric material with laser parameters in accordance with certain embodiments.

FIG. 7 is an electron micrograph image of a cut made through a layer of a low-k dielectric material with preferred laser parameters in accordance with certain embodiments. The cut shows that 1,064 nm pulsed picosecond output has cut through the low-k dielectric material without damaging the underlying silicon substrate.

In some embodiments, the laser system 10 is employed to process the low-k dielectric material (and optionally other device layers including, but not limited to, layers such as metals, oxides, polymers, and/or other soft materials), and then one or more nonlaser techniques, such as cutting with a mechanical saw blade, are employed to process most or all of the thickness of the wafer substrate material. In one example, the laser system 10 may be employed to remove the low-k dielectric material and optionally one or more other device layers from the streets before singulating workpieces 52 with a mechanical saw, such that during subsequent dicing with a saw blade, the blade makes contact only with the substrate material. This method prevents blade degradation due to the presence of a softer material on the more brittle substrate material. Benefits of this technique may include, but are not limited to, improved lifetime of saw blades and the reduction of damage to the edges of the cut in the substrate due to a contaminated blade.

In a particular example, the width of layer removal is slightly wider than the width of saw dicing. Such a wide cutting line can be made, for example, with 3-7 adjacent or partly overlapping cutting lines of 20-40 µm kerf width (an exemplary total width is approximately 120 µm, but this width can be adjusted to suit particular applications).

In some alternative embodiments, the laser system 10 can be configured to provide different laser output parameters that can be advantageously used to process the soft materials before a nonlaser technique is employed to process the wafer material. In other alternative embodiments, the laser system 10 can be configured to provide different laser output parameters that can be advantageously used to process the wafer material. Furthermore, an optional polarization tracking system 90 and/or an optional nonreflective chuck 100 may be used to facilitate laser dicing of the substrate of workpiece 52. These techniques, as well as segmented-cutting (stitch-cutting) techniques and alternative laser system configurations that may be used to implement them, are disclosed in detail in U.S. patent application Ser. Nos. 10/017,497, 11/332,815, and 10/187,400, and U.S. Pat. No. 6,676,878, which are herein incorporated by reference.

It will be obvious to those having skill in the art that many changes may be made to the details of the above-described embodiments without departing from the underlying principles of the invention. The scope of the present invention should, therefore, be determined only by the following claims.

The invention claimed is:

1. A method for laser processing a workpiece including a low-k dielectric material supported by a wafer substrate, comprising:

generating a first laser output of a first set of laser pulses including at least first and second laser pulses having a first set of laser parameters including a pulsewidth shorter than 100 picoseconds and having a substantially raw Gaussian irradiance profile characterized by a center region of a raw peak irradiance amount and a peripheral region of a raw peripheral irradiance amount that is less than the raw peak irradiance amount;

propagating the first set of lasers pulses of the first laser output along an optical path through a beam-shaping component that imparts greater uniformity to the first laser output to provide the first set of laser pulses with first shaped laser output such that the irradiance profile of the first set of laser pulses becomes characterized by a shaped peak irradiance amount that is reduced relative to the raw peak irradiance amount at the center region and by a shaped peripheral irradiance amount that is increased relative to the raw peripheral irradiance amount at the peripheral region determined by a shaped perimeter;

propagating a major portion of the first shaped laser output of the first set of laser pulses through a generally noncircular aperture positioned along the optical path at a distance optically downstream of the beam-shaping component and configured to convert the major portion of the first shaped laser output into first shaped apertured output such that the irradiance profile of the first set of laser pulses becomes characterized by an apertured peripheral region having a generally noncircular cross section and an apertured perimeter that is smaller the shaped perimeter;

directing the first shaped apertured output to impinge the low-k dielectric material such that the first and second laser pulses form first and second noncircular spot areas in the low-k dielectric material causing removal of an amount the low-k dielectric material, the second spot area partly overlapping the first spot area by a spot overlap region on the low-k dielectric material, the spot overlap region determining a spot nonoverlap nonregion of the second and first spot areas that corresponds to a bite size of the second laser pulse, the bite size being set within a range from 1 nm to 10 μm, and the beam shaping component, the generally noncircular aperture, the pulsewidth, and the bite size cooperating to cut through the low-k dielectric material such that the cut forms a kerf having a substantially flat and clean bottom and the substrate is undamaged.

2. The method of claim 1 in which the pulsewidth is shorter than 10 picoseconds.

3. The method of claim 1 in which the pulsewidth is longer than 1 femtosecond.

4. The method of claim 1 in which the wavelength is about 1.3 μm.

5. The method of claim 1 in which the laser pulse has peak power that is less than 75 μJ.

6. The method of claim 1 in which the laser pulse has peak power that is greater than 75 μJ.

7. The method of claim 1 in which the low-k dielectric material comprises a k value of less than 3.

8. The method of claim 7 in which the low-k dielectric material comprises SRO or SiCOH.

9. The method of claim 7 in which the low-k dielectric material comprises a fluorinated silicate glass, a fluorinated amorphous carbon, SiOB, benzocyclobutene (BCB), methyl silsesquioxane (MSQ), hydrogen silsesquioxane (HSQ), a methylated silica from tetramethyl silane, teflon (PTFE), a xerogel, a polymer nanfoam, a polyimide, a fluorinated polyimide, a polyimide-based polymer, a parylene-based polymer, a polyarylether.

10. The method of claim 1 in which the substrate comprises single-crystal, polycrystalline, or amorphous Si, GaAs, GaP, InP, Ge, silicon carbide, silicon nitride, sapphire, fused silica, glass, or a polymer.

11. The method of claim 1 in which the laser output is generated by an oscillator module in cooperation with an amplification module.

12. The method of claim 11 in which the oscillator module comprises a diode-pumped, solid-state (DPSS) master oscillator.

13. The method of claim 11 in which the amplification module comprises a single-pass, multipass, or regenerative DPSS amplifier.

14. The method of claim 11 in which the amplification module comprises a Nd:GdVO$_4$, Nd:YVO$_4$, Nd:YLF, Nd:glass, or Nd:YAG lasant.

15. The method of claim 11 in which the oscillator module comprises a pulsed semiconductor laser emitting picosecond pulses.

16. The method of claim 15 in which the pulsed semiconductor laser employs an InGaAs/AlGaAs or InGaAsP/InP strained quantum well structure.

17. The method of claim 11 in which the oscillator module comprises a pulsed fiber master oscillator.

18. The method of claim 17 in which the pulsed fiber master oscillator comprises a diode-pumped, Nd-doped silica fiber laser oscillator employing a semiconductor saturable absorbing mirror.

19. The method of claim 17 in which the pulsed fiber master oscillator comprises a diode-pumped, Yb-doped silica fiber laser oscillator employing a semiconductor saturable absorbing mirror.

20. The method of claim 11 in which the amplification module comprises a Yb-doped silica fiber laser amplifier.

21. The method of claim 11 in which the amplification module comprises a Nd-doped silica fiber laser amplifier.

22. The method of claim 11 in which the laser output comprises multiple independently triggered pulses or bursts of pulses selected from a pulse train emitted from the amplification module.

23. The method of claim 1 in which a mechanical saw is employed to dice the substrate after the target portion of the low-k dielectric material is removed.

24. The method of claim 1 in which the laser output comprises a wavelength of about 1.3 μm and in which generating the laser output employs a diode-pumped, solid-state master oscillator power amplifier which comprises:
  a diode-pumped, solid-state (DPSS) master oscillator; and
  a single-pass, multipass, or regenerative DPSS amplifier, wherein the amplifier comprises a Nd:GdVO$_4$, Nd:YVO$_4$, Nd:YLF, Nd:glass, or Nd:YAG lasant.

25. The method of claim 24 in which the laser output comprises multiple independently triggered pulses or bursts of pulses selected from a pulse train emitted from the amplification module.

26. The method of claim 24 in which the low-k dielectric material comprises a fluorinated silicate glass, a fluorinated amorphous carbon, SRO, SiCOH, SiOB, benzocyclobutene (BCB), methyl silsesquioxane (MSQ), hydrogen silsesquioxane (HSQ), a methylated silica from tetramethyl silane, teflon (PTFE), a xerogel, a polymer nanfoam, a polyimide, a fluorinated polyimide, a polyimide-based polymer, a parylene-based polymer, a polyarylether, and in which the substrate comprises single-crystal, polycrystalline, or amorphous Si, GaAs, GaP, InP, Ge, silicon carbide, silicon nitride, sapphire, fused silica, glass, or a polymer.

27. The method of claim 1 in which generating the laser output employs a diode-pumped fiber master oscillator fiber power amplifier which comprises:
  a diode-pumped, Nd-doped silica fiber master oscillator employing a semiconductor saturable absorbing mirror; and
  a Yb-doped silica fiber power amplifier.

28. The method of claim 1 in which generating the laser output employs a diode-pumped fiber master oscillator fiber power amplifier which comprises:
  a diode-pumped, Nd-doped silica fiber master oscillator employing a semiconductor saturable absorbing mirror; and
  a Nd-doped silica fiber power amplifier.

29. The method of claim 1 in which generating the laser output employs a diode-pumped fiber master oscillator fiber power amplifier which comprises:
  a diode-pumped, Yb-doped silica fiber master oscillator employing a semiconductor saturable absorbing mirror; and
  a Yb-doped silica fiber power amplifier.

30. The method of claim 1 in which generating the laser output employs a diode-pumped fiber master oscillator fiber power amplifier which comprises:
  a diode-pumped, Yb-doped silica fiber master oscillator employing a semiconductor saturable absorbing mirror; and
  a Nd-doped silica fiber power amplifier.

31. The method of claim 27 in which the laser output comprises multiple independently triggered pulses or bursts of pulses selected from a pulse train emitted from the diode-pumped fiber master oscillator fiber power amplifier.

32. The method of claim 1 wherein the generally noncircular cross section is square and the bite size is less than 1 μm.

33. The method of claim 1, further comprising:
  generating a second laser output of a second set of laser pulses having a second set of laser parameters that are different from the first set of laser parameters; and
  directing the second laser output at the substrate underlying the kerf to cut the substrate.

34. The method of claim 1, further comprising:
employing a cutting blade to cut the substrate underlying the kerf.

35. The method of claim 1 in which the first laser output has a wavelength greater than 1.1 μm and shorter than 5 μm.

36. The method of claim 7 in which at wavelengths longer than 532 nm, the laser output modifies an optical constant of the target portion of the low-k dielectric material while the optical constant of the wafer substrate is unchanged.

* * * * *